(12) United States Patent
Shen et al.

(10) Patent No.: US 12,113,431 B2
(45) Date of Patent: Oct. 8, 2024

(54) FLYING CAPACITOR THREE-LEVEL CONVERTER AND FLYING CAPACITOR THREE-LEVEL BUCK-BOOST CONVERTER

(71) Applicant: Delta Electronics (Shanghai) CO., LTD, Shanghai (CN)

(72) Inventors: Guoqiao Shen, Shanghai (CN); Jinfa Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 154 days.

(21) Appl. No.: 17/822,439

(22) Filed: Aug. 26, 2022

(65) Prior Publication Data

US 2023/0073486 A1  Mar. 9, 2023

(30) Foreign Application Priority Data

Sep. 7, 2021 (CN) .......................... 202111042825.6

(51) Int. Cl.
*H02M 1/32* (2007.01)
*H02M 1/00* (2006.01)
(Continued)

(52) U.S. Cl.
CPC ......... *H02M 1/0095* (2021.05); *H02M 1/327* (2021.05); *H02M 3/003* (2021.05);
(Continued)

(58) Field of Classification Search
CPC ................. H02M 1/327; H02M 3/003; H02M 3/07–078; H02M 3/158; H02M 3/1582;
(Continued)

(56) References Cited

U.S. PATENT DOCUMENTS

2018/0048255 A1  2/2018 Marvin et al.
2021/0083585 A1*  3/2021 Jiang .................... H02M 3/158
(Continued)

FOREIGN PATENT DOCUMENTS

CN  104270014 A  1/2015
CN  105379095 B  3/2019
(Continued)

OTHER PUBLICATIONS

Extended European Search Report dated Feb. 2, 2023 of European Application No. 22193446.6.

*Primary Examiner* — Fred E Finch, III
(74) *Attorney, Agent, or Firm* — Qinghong Xu

(57) ABSTRACT

Disclosed is a flying capacitor three-level converter, including a plurality of circuit units, wherein each of the plurality of circuit units includes: an input capacitor; a bridge arm, electrically connected with the input capacitor in parallel, wherein the bridge arm includes a first switch, a second switch, a third switch and a fourth switch electrically and sequentially connected in series; and a flying capacitor unit, wherein the flying capacitor unit includes a first capacitor and a second capacitor, and the first capacitor and the second capacitor are electrically connected in parallel and electrically connected with a series branch in parallel, and the series branch includes the second switch and the third switch; wherein the input capacitor, the first switch, the first capacitor and the fourth switch form a first switching loop, and the second capacitor, the second switch and the third switch form a second switching loop.

18 Claims, 10 Drawing Sheets

(51) Int. Cl.
  *H02M 3/00*    (2006.01)
  *H02M 3/07*    (2006.01)
  *H05K 7/20*    (2006.01)
  *H02M 3/158*   (2006.01)

(52) U.S. Cl.
  CPC ............ *H02M 3/07* (2013.01); *H02M 3/1582* (2013.01); *H02M 3/1584* (2013.01); *H05K 7/20909* (2013.01)

(58) Field of Classification Search
  CPC .............. H02M 3/1584; H02M 7/4837; H05K 7/20909
  See application file for complete search history.

(56)          References Cited

U.S. PATENT DOCUMENTS

| | | |
|---|---|---|
| 2022/0190712 A1 | 6/2022 | Chen et al. |
| 2023/0126760 A1* | 4/2023 | Liu ........................ H05K 1/181 323/271 |

FOREIGN PATENT DOCUMENTS

| | | |
|---|---|---|
| CN | 112636613 A | 4/2021 |
| EP | 3544168 A1 | 9/2019 |
| WO | 2020094663 A1 | 5/2020 |

* cited by examiner

FLYING CAPACITOR THREE-LEVEL CONVERTER AND FLYING CAPACITOR THREE-LEVEL BUCK-BOOST CONVERTER

TECHNICAL FIELD

The present disclosure relates to the technical field of converters, and in particular, to a flying capacitor three-level converter, a flying capacitor three-level buck-boost converter and a flying capacitor multilevel converter.

BACKGROUND

In high-voltage and high-power converter systems, the technology of flying capacitor multilevel conversion becomes more popular and are widely used in more applications. However, the multi-level converters usually need more switches, and especially with the increasing of voltage and the number of levels, the switches in a single bridge arm increases. In addition, due to the requirement of increasing power capacity, the structure with a plurality of interleaving bridge arms in parallel is usually adopted, which further increases the number of switches.

During the operation of a flying capacitor multilevel converter, on the one hand, the switches may generate electrical loss, and it is necessary to design a heat dissipation channel for the switches; and on the other hand, the switches need to subject to voltage stress and current stress during a switching operation, the design for a commutation loop of the switches is often required to be very small so as to reduce the adverse effect of the stress on the switches.

In addition, in many applications, the flying capacitor multilevel converters are in different working modes, thus the switches of a plurality of bridge arms need to operate in different switching states and meet different electrical and structural requirements, which further increase the difficulty of the layout of the switches.

The above information disclosed in the background section is only used to strengthen the understanding of the background of the present disclosure, therefore, it may include information that does not constitute the prior art known to those skilled in the art.

SUMMARY

The present disclosure provides a flying capacitor three-level converter, a flying capacitor three-level buck-boost converter and a flying capacitor multilevel converter, which are able to reduce the voltage stress and thermal stress of the switch to make the switching operation safer and more reliable, and also allow the internal circuit layout of the product to be simple and convenient, which is beneficial to electrical design and structural design.

Other features and advantages of the present disclosure will become apparent through the following detailed description, or will be partly learned through the practice of the present disclosure.

The embodiments of the present disclosure provide a flying capacitor three-level converter, including a plurality of circuit units, where each of the plurality of circuit units includes: an input capacitor; a bridge arm, electrically connected with the input capacitor in parallel, wherein the bridge arm includes a first switch, a second switch, a third switch and a fourth switch electrically and sequentially connected in series; and a flying capacitor unit, where the flying capacitor unit includes first capacitor and a second capacitor, and the first capacitor and the second capacitor are electrically connected in parallel and electrically connected with a series branch in parallel, and the series branch includes the second switch and the third switch; where the input capacitor, the first switch, the first capacitor and the fourth switch form a first switching loop, and the second capacitor, the second switch and the third switch form a second switching loop.

The embodiments of the present disclosure provide a flying capacitor three-level buck-boost converter, including one or more circuit units, where each circuit unit of the one or more circuit units includes a first flying capacitor unit, a second flying capacitor unit, an input capacitor, an output capacitor, an inductor, a first bridge arm and a second bridge arm; the input capacitor is electrically connected in parallel with the first bridge arm, and the output capacitor is electrically connected in parallel with the second bridge arm; the first bridge arm includes a first switch, a second switch, a third switch, and a fourth switch, where the first switch, the second switch, the third switch and the fourth switch are sequentially connected in series; the second bridge arm includes a fifth switch, a sixth switch, a seventh switch, and an eighth switch, where the fifth switch, the sixth switch, the seventh switch and the eighth switch are sequentially connected in series; the first flying capacitor unit includes a first capacitor and a second capacitor, where the first capacitor and the second capacitor are electrically connected in parallel and are electrically connected in parallel with a first series branch, and the first series branch includes the second switch and the third switch in the first bridge arm; the input capacitor, the first switch, the first capacitor and the fourth switch form a first switching loop; the second switch, the third switch and the second capacitor form a second switching loop; the second flying capacitor unit includes a third capacitor and a fourth capacitor, where the third capacitor and the fourth capacitor are electrically connected in parallel and are electrically connected in parallel with a second series branch, and the second series branch includes the sixth switch and the seventh switch in the second bridge arm; the output capacitor, the fifth switch, the third capacitor and the eighth switch form a third switching loop; the sixth switch, the seventh switch and the fourth capacitor form a fourth switching loop; and the inductor is coupled between a junction node of the second switch and the third switch in the first bridge arm and a junction node of the sixth switch and the seventh switch in the second bridge arm.

The embodiments of the present disclosure provide a flying capacitor multilevel converter, including N circuit units, where each circuit unit of the N circuit units includes m flying capacitor units, an input capacitor and a bridge arm, where N is a positive integer greater than 1, and m is a positive integer greater than or equal to 1; where the bridge arm includes $2 \times (m+1)$ switches, and the $2 \times (m+1)$ switches are sequentially connected in series; where each of the m flying capacitor units includes a first capacitor and a second capacitor, and the first capacitor is electrically connected in parallel with the second capacitor; where a first flying capacitor unit of the m flying capacitor units is electrically connected in parallel at both ends of a series branch which is defined by a second switch to the $(2m+1)$th switch, and the input capacitor, a first switch, the first capacitor of the first flying capacitor unit and the $2 \times (m+1)$th switch form a first switching loop; where the second capacitor of the first flying capacitor unit, the second switch, the first capacitor of a second flying capacitor unit of the m flying capacitor units and the $(2m+1)$th switch form a second switching loop; where a $k^{th}$ flying capacitor unit of the m flying capacitor units is electrically connected in parallel at both ends of a series branch which is defined by the (k+1)th switch to the (2m+2−k)th switch, where k is a natural number from 2 to m; where the second capacitor of the (k−1)th flying capacitor unit of the m flying capacitor units, a $k^{th}$ switch, the first capacitor of the $k^{th}$ flying capacitor unit and the (2m+3−k)th switch form a $k^{th}$ switching loop; where the second capacitor of a $m^{th}$ flying capacitor unit of the m flying capacitor units, a (m+1)th switch and a (m+2)th switch form a (m+1)th switching loop.

In the flying capacitor three-level converter provided by the embodiments of the present disclosure, each flying capacitor unit includes a first capacitor and a second capacitor electrically connected in parallel, and these two capacitors respectively form a switching loop with two pairs of switches with complementary driving signals and connected to the flying capacitor unit, so as to facilitate the absorption of switching voltage spikes; each pair of the switches with complementary driving signals is protected by a switching loop (including a capacitor), so that the voltage stress thereof is smaller than that of all the switches in a same bridge arm being arranged together, and the operation of the switches is safer and more reliable; each pair of the switches with complementary driving signals has an exclusive compact switching loop, so as to allow the internal circuit layout of the product to be simple and convenient, and facilitate electrical design and structural design; and the switches with complementary driving signals of a same level in different circuit units are arranged on a same heat dissipation unit, so as to facilitate uniform distribution of heat load and maximize the utilization of heat dissipation resources, so that the available heat dissipation capacity of other operating circuit units will be increased when some circuit units do not work, thereby reducing thermal stress and improving high-temperature derating operation capacity and fault operation load carrying capacity, which is beneficial to reduce costs and improve performance.

It should be understood that the above general description and the following detailed description are only exemplary and cannot limit the present disclosure.

BRIEF DESCRIPTION OF THE DRAWINGS

The above and other objects, features and advantages of the present disclosure will become more apparent by describing its example embodiments in detail with reference to the accompanying drawings.

DETAILED DESCRIPTION

Figure 1:
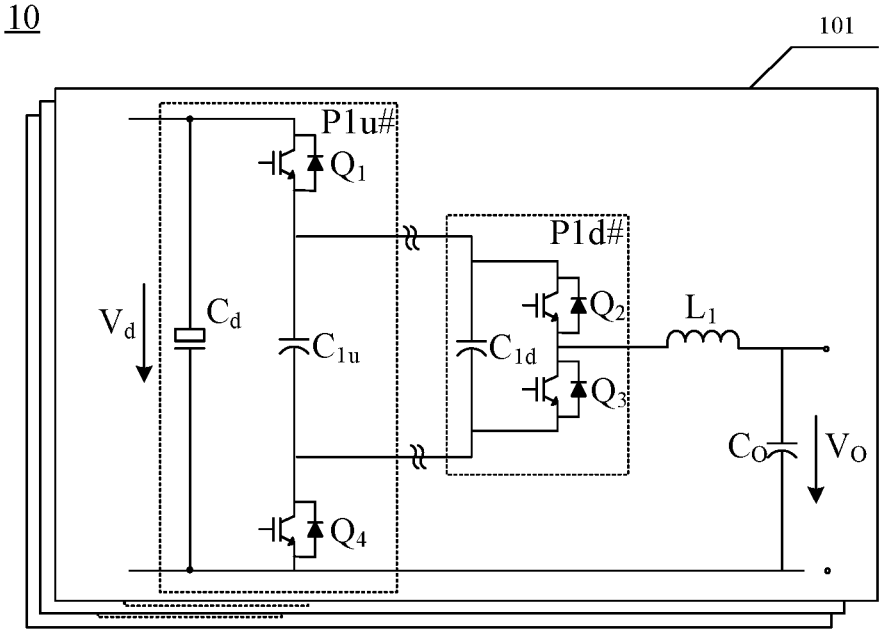
FIG. 1 is a schematic diagram illustrating a flying capacitor three-level converter according to an exemplary embodiment.

Example embodiments will now be described more throughoutly with reference to the accompanying drawings. However, the example embodiments can be implemented in various forms, and should not be construed as being limited to the examples set forth herein; rather, the provision of these embodiments will make the present disclosure more comprehensive and complete, and fully convey the concept of the example embodiments to those skilled in the art. The drawings are only schematic diagrams of the present disclosure, and are not necessarily drawn to scale. The same reference numerals in the drawing denote the same or similar parts, and thus the elaborated description thereof will be omitted.

In addition, the described features, structures or characteristics may be combined in one or more embodiments in any suitable manner. In the following description, many specific details are provided to give a full understanding of the embodiments of the present disclosure. However, those skilled in the art will realize that the technical solutions of the present disclosure may be practiced with omitting one or more of the specific details, or other methods, components, apparatuses, steps etc. may be adopted. In other cases, well-known structures, methods, apparatuses, implementations or operations are not shown or described in detail in order to avoid confusing and obscuring various aspects of the present disclosure.

The terms "first" and "second" are only for descriptive purposes and cannot be construed as indicating or implying relative importance or implicitly indicating the number of technical features indicated. Thus, the features defined with "first" and "second" may explicitly or implicitly include one or more of the features.

FIG. 1 is a schematic diagram illustrating a flying capacitor three-level converter according to an exemplary embodiment.

Referring to FIG. 1, the flying capacitor three-level converter 10 may include N circuit units, where N is a positive integer greater than 1.

The following will take one of the circuit units 101 as an example for description.

In an embodiment of the present disclosure, the circuit unit 101 may include a flying capacitor unit, an input capacitor $C_d$ and a bridge arm.

The input capacitor $C_d$ is connected in parallel with the bridge arm.

The bridge arm may include a first switch $Q_1$, a second switch $Q_2$, a third switch $Q_3$ and a fourth switch $Q_4$, where the first switch $Q_1$, the second switch $Q_2$, the third switch $Q_3$ and the fourth switch $Q_4$ are sequentially connected in series.

In an exemplary embodiment, the bridge arms of all the circuit units are connected in parallel, that is, the input capacitors $C_d$ of all the circuit units are connected in parallel.

The flying capacitor unit may include a first capacitor $C_{1u}$ and a second capacitor $C_{1d}$, where the first capacitor $C_{1u}$ and the second capacitor $C_{1d}$ are connected in parallel, and at the same time are connected in parallel with a series branch which includes the second switch $Q_2$ and the third switch $Q_3$.

A capacitance value of the first capacitor $C_{1u}$ and a capacitance value of the second capacitor $C_{1d}$ may be equal or may be different.

In an exemplary embodiment, the capacitance value of the first capacitor $C_{1u}$ is greater than the capacitance value of the second capacitor $C_{1d}$; or the capacitance value of the first capacitor $C_{1u}$ is less than the capacitance value of the second capacitor $C_{1d}$.

In an exemplary embodiment, a distance between the first capacitor $C_{1u}$ and the second capacitor $C_{1d}$ is a preset distance.

In an embodiment of the present disclosure, the first capacitor $C_{1u}$ and the second capacitor $C_{1d}$ may be arranged apart by a preset distance, and the size of the preset distance may be set according to actual situations, which is not limited in the present disclosure.

In an embodiment of the present disclosure, the flying capacitor three-level converter 10 may be a bidirectional converter or a unidirectional converter.

In an embodiment of the present disclosure, the input capacitor $C_d$, the first switch $Q_1$, the first capacitor $C_{1u}$ and the fourth switch $Q_4$ form a first switching loop, and the second capacitor $C_{1d}$, the second switch $Q_2$ and the third switch $Q_3$ form a second switching loop. In this embodiment, driving signals of the switches $Q_2$ and $Q_3$ are complementary, while driving signals of the switches $Q_1$ and $Q_4$ are complementary.

In an embodiment of the present disclosure, the input capacitor $C_d$, the first switch $Q_1$, the first capacitor $C_{1u}$ and the fourth switch $Q_4$ form the first switching loop, and may form a first compact connection loop P1$u$ # in layout, and the second capacitor $C_{1d}$, the second switch $Q_2$ and the third switch $Q_3$ form the second switching loop, and may form a second compact connection circuit P1$d$ # in layout.

In an embodiment of the present disclosure, a first direct current (DC) voltage at a first end of the circuit unit 101 is $V_d$, and a second DC voltage at a second end of the flying capacitor three-level converter 10 is $V_O$. The circuit unit 101 may further include an inductor $L_1$, and the flying capacitor three-level converter further includes an output capacitor $C_O$, where an end of the inductor $L_1$ is electrically connected to a junction node of the second switch $Q_2$ and the third switch $Q_3$, and the other end is connected to an end of the output capacitor $C_O$.

In the flying capacitor three-level converter provided by the embodiments of the present disclosure, each flying capacitor unit includes a first capacitor and a second capacitor connected in parallel, and these two capacitors respectively form a switching loop with two pairs of switches with complementary driving signals and being connected to the flying capacitor unit. For example, the first capacitor $C_{1u}$ and the switches $Q_1$ and $Q_4$ form a first switching loop, and the second capacitor $C_{1d}$ and the switches $Q_2$ and $Q_3$ form a second switching loop, so as to facilitate the absorption of switching voltage spikes. Each pair of the switches with complementary driving signals is protected by the switching loop (including the capacitor), so that the voltage stress thereof is smaller than that of all switches in a same bridge arm being arranged together, and the operation of the switches is safer and more reliable. Each pair of the switches with complementary driving signals has an exclusive compact switching loop, allowing the internal line layout of the product to be simple and convenient, and being beneficial to electrical design and structural design. The switches with complementary driving signals of a same level in different circuit units are arranged on a same heat dissipation unit, so as to facilitate uniform distribution of heat load and maximize the utilization of heat dissipation resources, therefore the available heat dissipation capacity of other operating circuit units will be increased when some circuit units do not work, thereby reducing thermal stress and improving high-temperature derating operation capacity and fault operation load carrying capacity, which is beneficial to reduce costs and improve performance.

Figure 2:
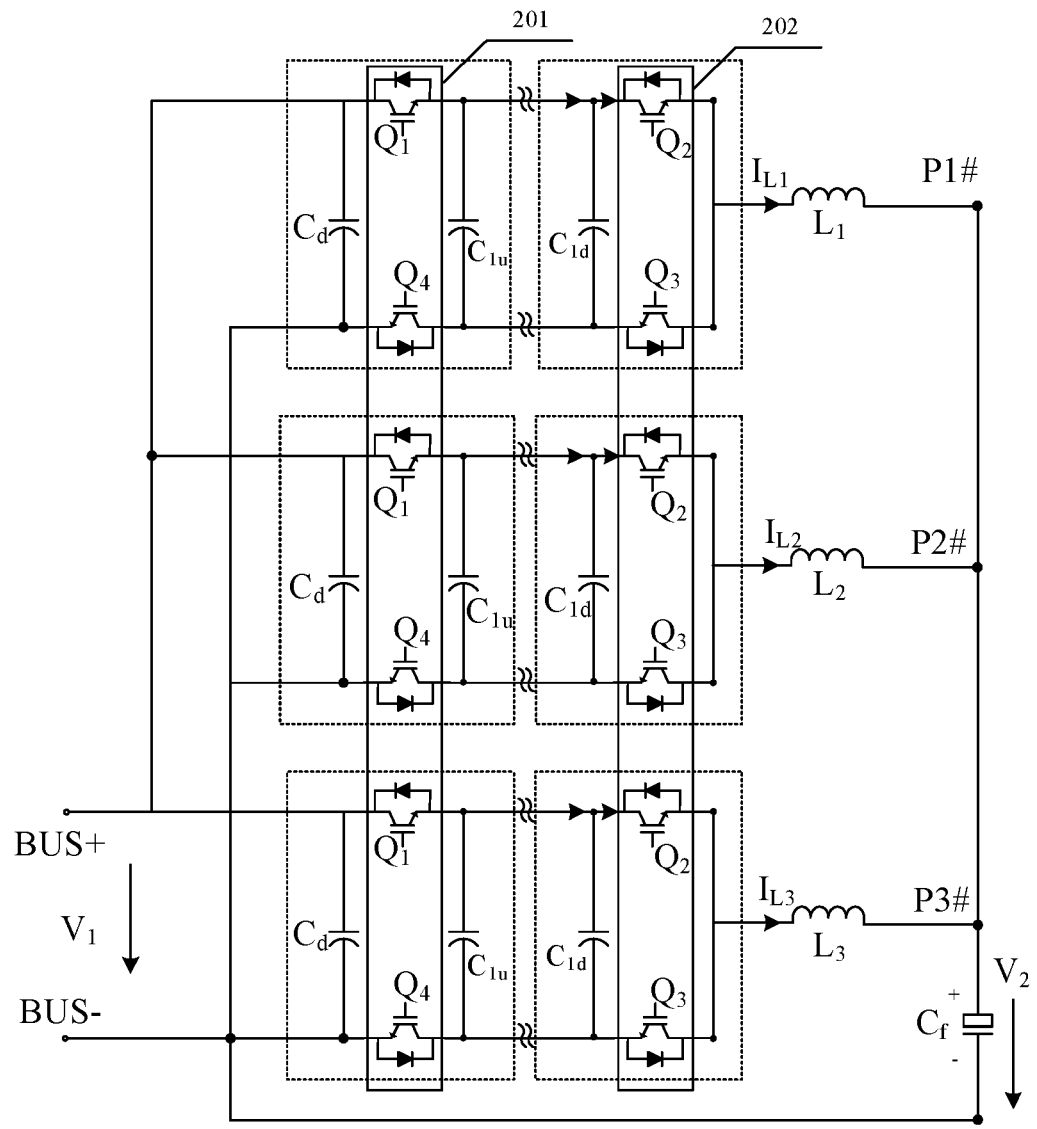
FIG. 2 is a schematic diagram illustrating another flying capacitor three-level converter according to an exemplary embodiment.

FIG. 2 is a schematic diagram illustrating another flying capacitor three-level converter according to an exemplary embodiment.

Figure 3A:
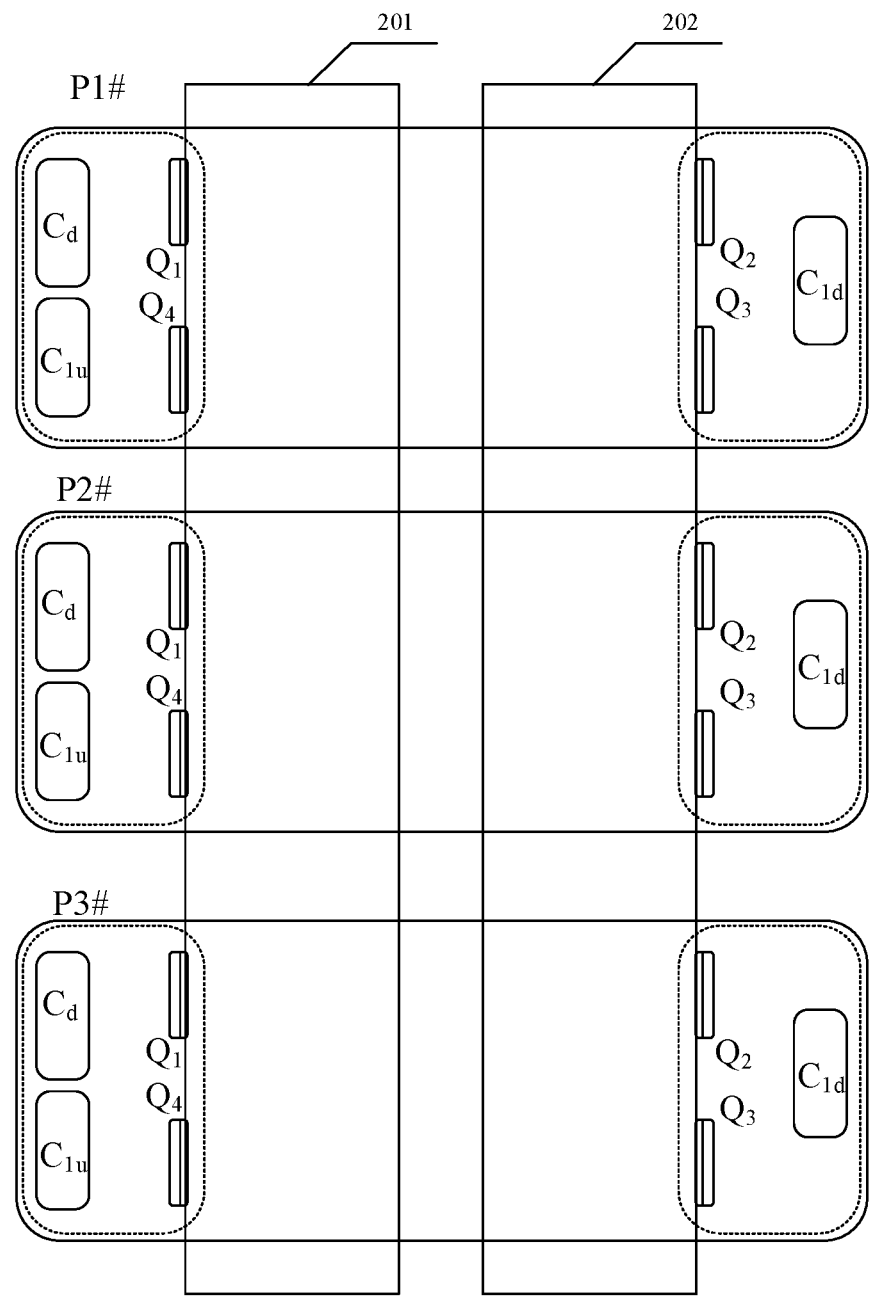
FIG. 3A is a schematic diagram of a switch layout of the flying capacitor three-level converter shown in FIG. 2.
Figure 3B:
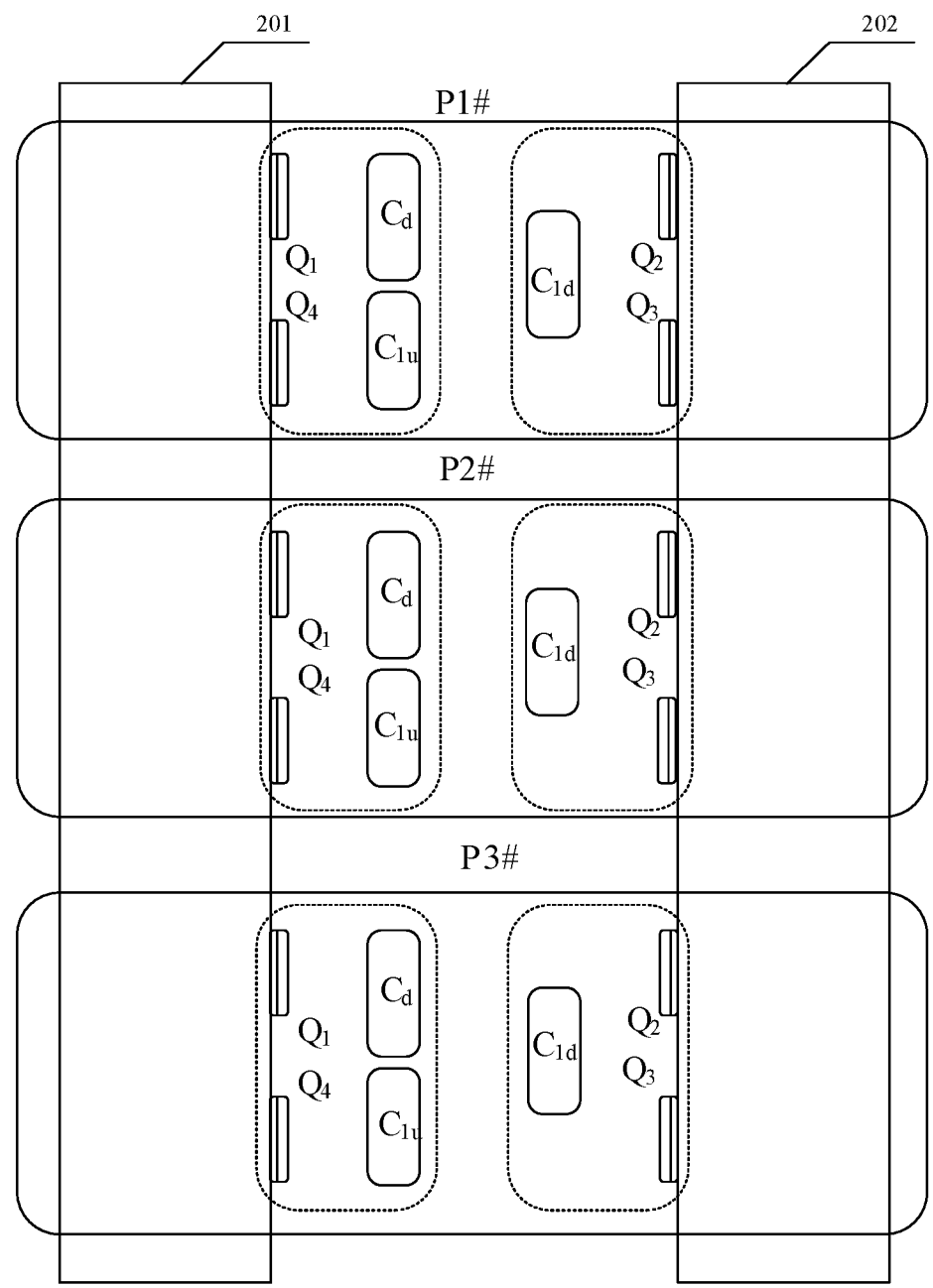
FIG. 3B is a schematic diagram of another switch layout of the flying capacitor three-level converter shown in FIG. 2.
Figure 3C:
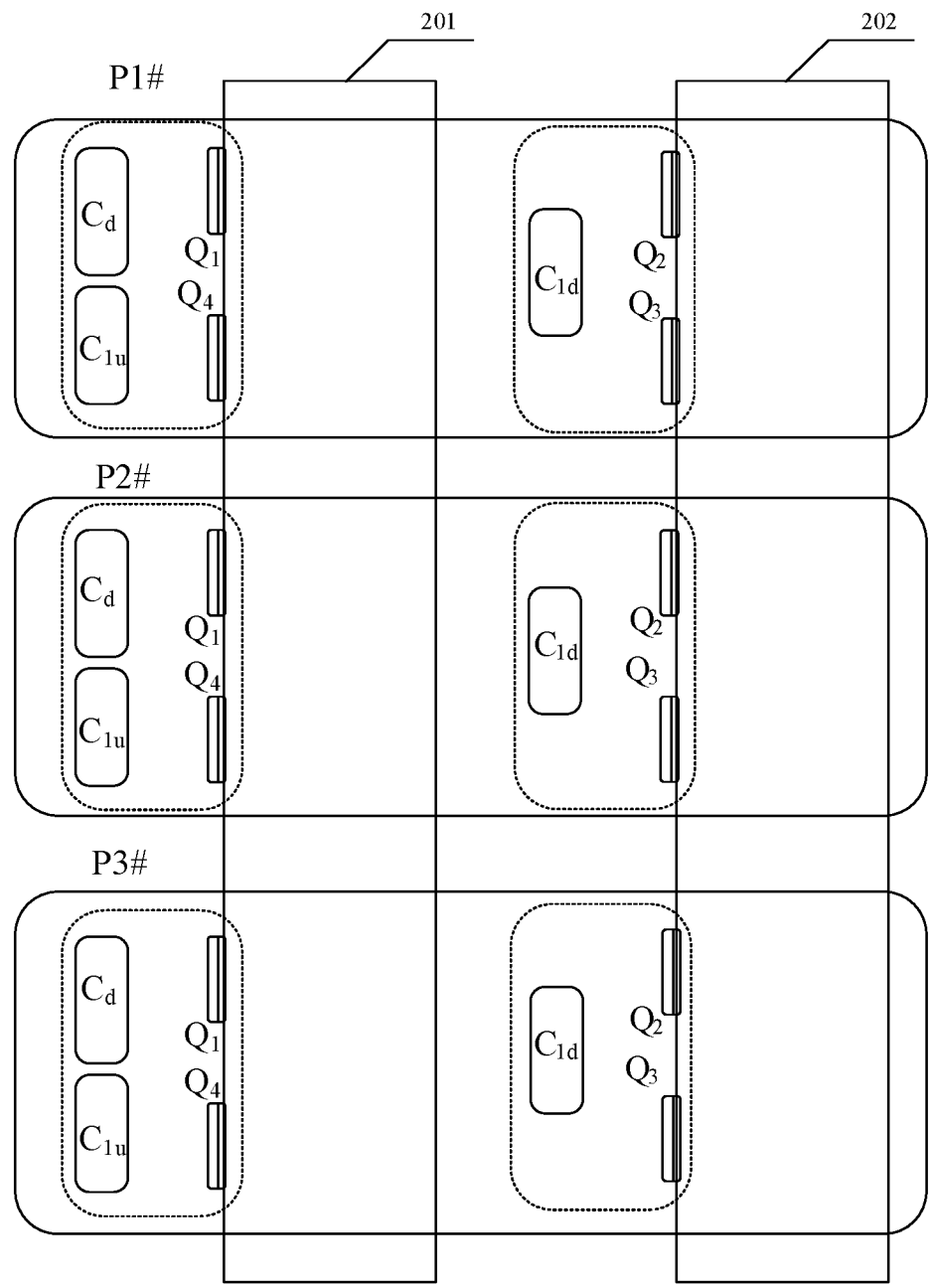
FIG. 3C is a schematic diagram of further another switch layout of the flying capacitor three-level converter shown in FIG. 2.

FIG. 3A, FIG. 3B and FIG. 3C are schematic diagrams of the switch layout of the flying capacitor three-level converter shown in FIG. 2.

Referring to FIG. 2, the flying capacitor three-level converter having three circuit units is taken as an example for description, while the present disclosure is not limited thereto.

In an embodiment of the present disclosure, the flying capacitor three-level converter has three circuit units P1 #, P2 # and P3 #, where each circuit unit includes a flying capacitor unit, an input capacitor $C_d$ and a bridge arm, each bridge arm includes a first switch $Q_1$, a second switch $Q_2$, a third switch $Q_3$ and a fourth switch $Q_4$, and each flying capacitor unit includes a first capacitor $C_{1u}$ and a second capacitor $C_{1d}$ connected in parallel.

In this embodiment, the bridge arms of all the circuit units P1 #, P2 # and P3 # are connected in parallel, that is, the input capacitors of the circuit units are connected in parallel with a first end BUS+ and BUS− of the flying capacitor three-level converter, where a first DC voltage at the first end of the flying capacitor three-level converter is $V_1$, and a second DC voltage at a second end of the flying capacitor three-level converter is $V_2$.

Bounding by the first capacitor $C_{1u}$ and the second capacitor $C_{1d}$ connected in parallel, each bridge arm is divided into two parts which respectively form a first switching loop and a second switching loop, where the first switching loop and the second switching loop may be a two-level compact connection loop (a first compact connection loop and a second compact connection loop), where each compact connection loop includes two switches with complementary driving signals and one capacitor. For example, the first compact connection loop includes an input capacitor $C_d$, a first switch $Q_1$, a first capacitor $C_{1u}$ and a fourth switch $Q_4$, and the second compact connection loop includes a second capacitor $C_{1d}$, a second switch $Q_2$ and a third switch $Q_3$.

In an exemplary embodiment, the circuit unit P1 # may further include an inductor $L_1$, the circuit unit P2 # may further include an output inductor $L_2$, the circuit unit P3 # inductor may further include an output inductor $L_3$. The flying capacitor three-level converter further includes an output capacitor $C_f$, where one end of the inductor $L_1$ is electrically connected to the junction node of the second switch $Q_2$ and the third switch $Q_3$ in the circuit unit P1 #, and the other end is connected to an end of the output capacitor $C_f$. One end of the inductor $L_2$ is electrically connected to the junction node of the second switch $Q_2$ and the third switch $Q_3$ in the circuit unit P2 #, and the other end is connected to an end of the output capacitor $C_f$. One end of the inductor $L_3$ is electrically connected to the junction node of the second switch $Q_2$ and the third switch $Q_3$ in the circuit unit P3 #, and the other end is connected to an end of the output capacitor $C_f$.

In an exemplary embodiment, the flying capacitor three-level converter may further include a first heat dissipation unit 201 and a second heat dissipation unit 202.

In an exemplary embodiment, the first heat dissipation unit and the second heat dissipation unit have a same or similar heat dissipation condition.

The first switches and the fourth switches in all the first switching loops (that is, the first switching loop in each circuit unit) are arranged on the first heat dissipation unit 201, and the second switches and the third switches in all the second switching loops (that is, the second switching loop in each circuit unit) are arranged on the second heat dissipation unit 202.

In the structural layout of the converter, all the switches of N first switching loops in N circuit units may be installed on a first radiator or in a first heat dissipation area, and all the switches of N second switching loops in N circuit units may be installed on a second radiator or in a second heat dissipation area.

The switches in the compact connection loops of a same level may be installed on a same radiator or in a same heat dissipation area, and the switches in the compact connection loops of different levels may be installed separately on two different radiators or in two different heat dissipation areas.

The above-mentioned first and second radiators or the first and second heat dissipation areas have a same or similar heat dissipation condition in the converter.

It should be noted that the first heat dissipation unit 201 and the second heat dissipation unit 202 in the embodiments of the present disclosure may be two parts of a same radiator, or may be two separate radiators. Having a same or similar heat dissipation condition in the embodiments of the present disclosure does not necessarily require that the heat dissipation condition of the first heat dissipation unit and that of the second heat dissipation unit are exactly the same, and a difference between the heat dissipation condition of the first heat dissipation unit and that of the second heat dissipation unit within a certain error range is acceptable. The above-mentioned certain error range may be set according to actual situations, which is not limited in the present disclosure.

The devices and connection relationships of the circuit unit shown in FIG. 2 which are the same as those of the circuit unit shown in FIG. 1 may be referred to the description related to FIG. 1, which will not be elaborated here.

Referring to FIG. 3A, in an exemplary embodiment, the input capacitor $C_d$ and the first capacitor $C_{1u}$ of each circuit unit are both located at a first side of the first heat dissipation unit 201, and the second capacitor $C_{1d}$ is located at a second side of the second heat dissipation unit 202.

Referring to FIG. 3B, in an exemplary embodiment, the input capacitor $C_d$ and the first capacitor $C_{1u}$ of each circuit unit are both located at a second side of the first heat dissipation unit 201, and the second capacitor $C_{1d}$ is located at a first side of the second heat dissipation unit 202.

Referring to FIG. 3C, in an exemplary embodiment, the input capacitor $C_d$ and the first capacitor $C_{1u}$ of each circuit unit are both located at the first side of the first heat dissipation unit 201, and the second capacitor $C_{1d}$ is located at the first side of the second heat dissipation unit 202.

In an exemplary embodiment, the input capacitor and the first capacitor of each circuit unit are both located at a same side of the first heat dissipation unit, and the second capacitor of each circuit unit is located at a same side of the second heat dissipation unit.

In an exemplary embodiment, the input capacitor $C_d$ and the first capacitor $C_{1u}$ of each circuit unit are arranged close to the corresponding first switch $Q_1$ and fourth switch $Q_4$; and the second capacitance $C_{1d}$ is arranged close to the corresponding second switch $Q_2$ and third switch $Q_3$.

The input capacitor and the first capacitor of each circuit unit may be arranged on a side of the first heat dissipation unit 201 that is close to the corresponding first switch and fourth switch, and the second capacitor of each circuit unit may be arranged on a side of the second heat dissipation unit 202 that is close to the corresponding second switch and third switch.

In an exemplary embodiment, a distance between the first capacitor and the second capacitor of each flying capacitor unit is a preset distance, and the preset distance may be selected according to actual needs.

In the flying capacitor three-level converter provided by the embodiments of the present disclosure, when N circuit units are in parallel operation, interleaved operation or complementary operation, the switches of the same level in different circuit units are arranged on a same heat dissipation unit, so as to facilitate uniform distribution of heat load and maximize the utilization of heat dissipation resources, in this way, the available heat dissipation capacity of other circuit units can be increased when some circuit units do not work, thereby reducing thermal stress and improving high-temperature derating operation capacity and fault operation load carrying capacity, which is beneficial to reduce costs and improve performance.

Figure 4:
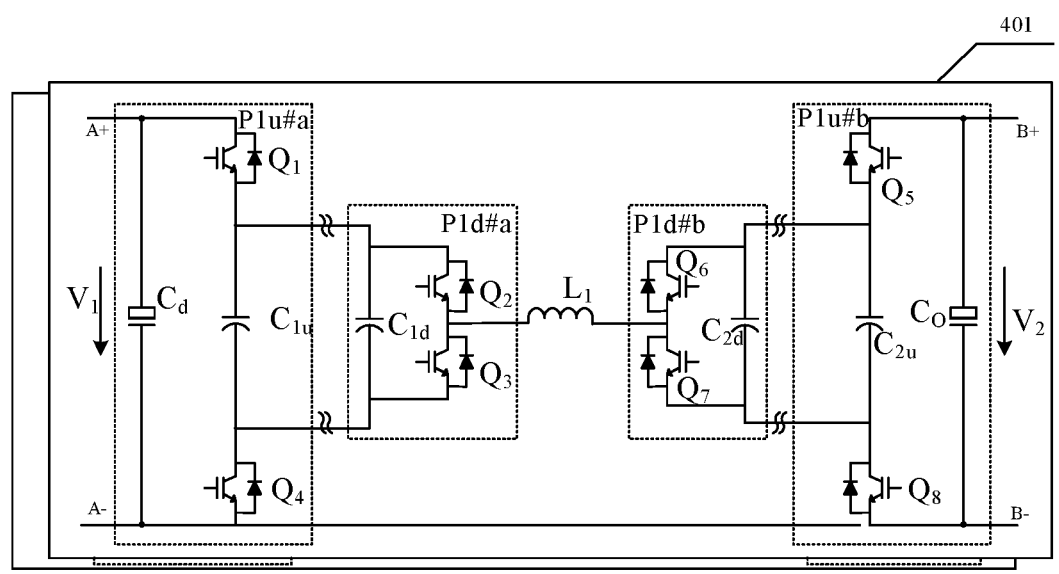
FIG. 4 is a schematic diagram illustrating a flying capacitor three-level buck-boost converter according to an exemplary embodiment.

FIG. 4 is a schematic diagram illustrating a flying capacitor three-level buck-boost converter according to an exemplary embodiment.

Referring to FIG. 4, the flying capacitor three-level voltage buck-boost converter may include N circuit units, where N is a positive integer greater than or equal to 1.

The following will take one of circuit units 401 as an example for description.

In an embodiment of the present disclosure, a circuit unit 401 may include a first flying capacitor unit and a second flying capacitor unit, an input capacitor $C_d$, an output capacitor $C_O$, an inductor $L_1$, a first bridge arm and a second bridge arm.

The input capacitor $C_d$ is connected in parallel with the first bridge arm, and the output capacitor $C_O$ is connected in parallel with the second bridge arm.

The first bridge arm may include a first switch $Q_1$, a second switch $Q_2$, a third switch $Q_3$ and a fourth switch $Q_4$, where the first switch $Q_1$, the second switch $Q_2$, the third switch $Q_3$ and the fourth switch $Q_4$ are sequentially connected in series. The second bridge arm may include a fifth switch $Q_5$, a sixth switch $Q_6$, a seventh switch $Q_7$ and an eighth switch $Q_8$, where the fifth switch $Q_5$, the sixth switch $Q_6$, the seventh switch $Q_7$ and the eighth switch $Q_8$ are sequentially connected in series.

The first flying capacitor unit may include a first capacitor $C_{1u}$ and a second capacitor $C_{1d}$, where the first capacitor $C_{1u}$ and the second capacitor $C_{1d}$ are connected in parallel, and at the same time are connected in parallel with a series branch which includes the second switch $Q_2$ and the third switch $Q_3$ in the first bridge arm.

The second flying capacitor unit may include a third capacitor $C_{2u}$ and a fourth capacitor $C_{2d}$, where the third capacitor $C_{2u}$ and the fourth capacitor $C_{2d}$ are connected in parallel, and are connected in parallel with a series branch which includes the sixth switch $Q_6$ and the seventh switch $Q_7$ in the second bridge arm.

The input capacitor $C_d$, the first switch $Q_1$, the first capacitor $C_{1u}$ and the fourth switch $Q_4$ form a first switching loop; and the second switch $Q_2$, the third switch $Q_3$ and the second capacitor $C_{1d}$ form a second switching loop.

The output capacitor $C_O$, the fifth switch $Q_5$, the third capacitor $C_{2u}$, and the eighth switch $Q_8$ form a third switching loop; and the sixth switch $Q_6$, the seventh switch $Q_7$ and the fourth capacitor $C_{2d}$ form a fourth switching loop.

In an embodiment of the present disclosure, the input capacitor $C_d$, the first switch $Q_1$, the first capacitor $C_{1u}$ and the fourth switch $Q_4$ form a first switching loop, and may form a first compact connection loop P1u #a in layout; the second capacitor $C_{1d}$, the second switch $Q_2$ and the third switch $Q_3$ form a second switching loop, and may form a second compact connection loop P1d #a in layout; the output capacitor $C_O$, the fifth switch $Q_5$, the third capacitor $C_{2u}$ and the eighth switch $Q_8$ form a third switching loop, and may form a third compact connection loop P1u #b in layout; and the sixth switch $Q_6$, the seventh switch $Q_7$, and the fourth capacitor $C_{2d}$ form a fourth switching loop, and may form a fourth compact connection loop P1d #b in layout.

The inductor L is electrically coupled between a junction node of the second switch $Q_2$ and the third switch $Q_3$ in the first bridge arm and a junction node of the sixth switch $Q_6$ and the seventh switch $Q_7$ in the second bridge arm.

In an exemplary embodiment, if N is greater than 1, then all the first bridge arms are connected in parallel, and all the second bridge arms are connected in parallel.

In the flying capacitor three-level buck-boost converter provided by the embodiments of the present disclosure, each flying capacitor unit includes two capacitors connected in parallel, which respectively form a switching loop with two pairs of switches that are connected to the flying capacitor unit and have complementary driving signals, so as to facilitate the absorption of switching voltage spikes; each pair of switches with complementary driving signals is protected by the switching loop (including a capacitor), so that the voltage stress thereof is smaller than that of all switches in the same bridge arm being arranged together, and the operation of the switches is safer and more reliable; and each pair of the switches with complementary driving signals has an exclusive compact switching loop, allowing the internal circuit layout of the product to be simple and convenient, and being beneficial to electrical design and structural design.

Figure 5:
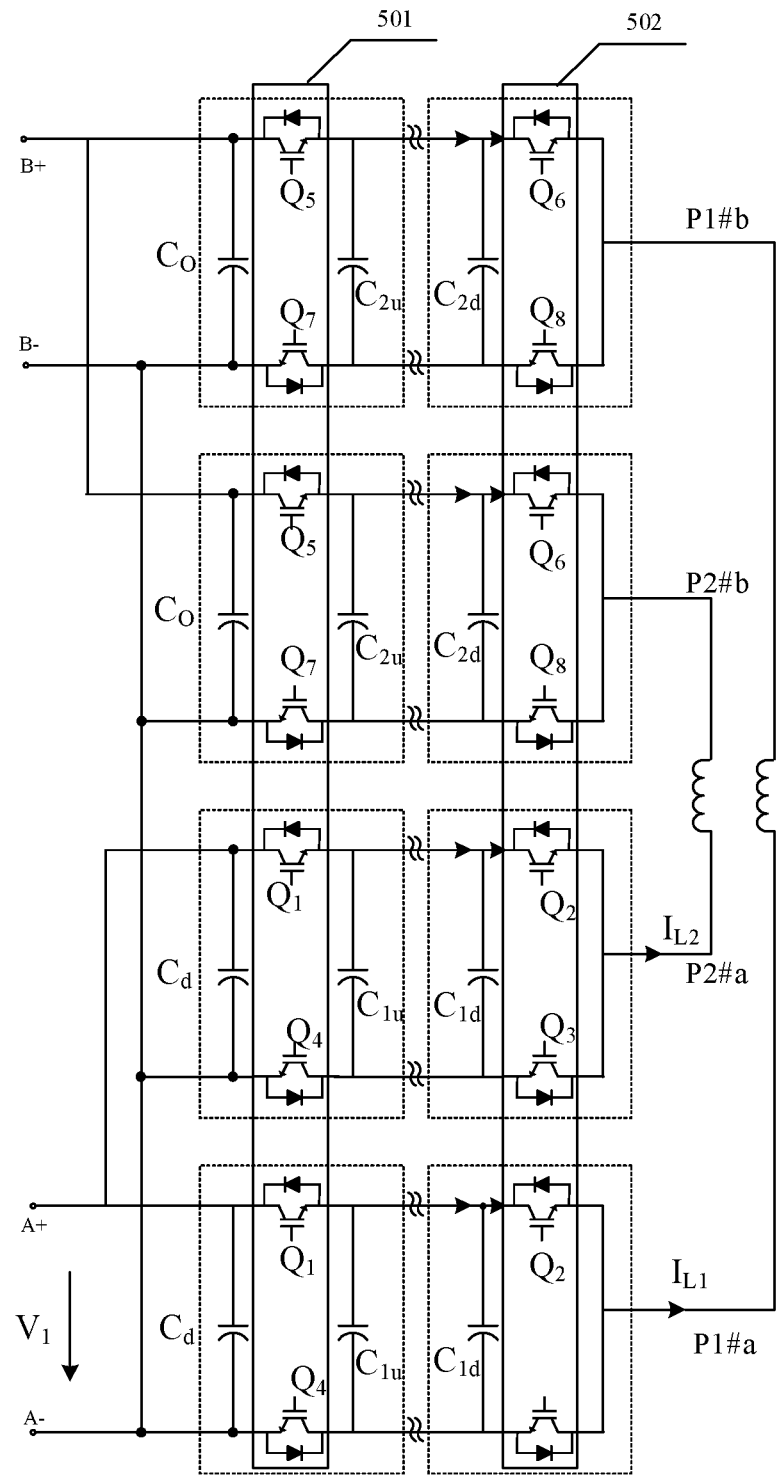
FIG. 5 is a schematic diagram illustrating another flying capacitor three-level buck-boost converter according to an exemplary embodiment.

FIG. 5 is a schematic diagram illustrating another flying capacitor three-level buck-boost converter according to an exemplary embodiment.

Figure 6:
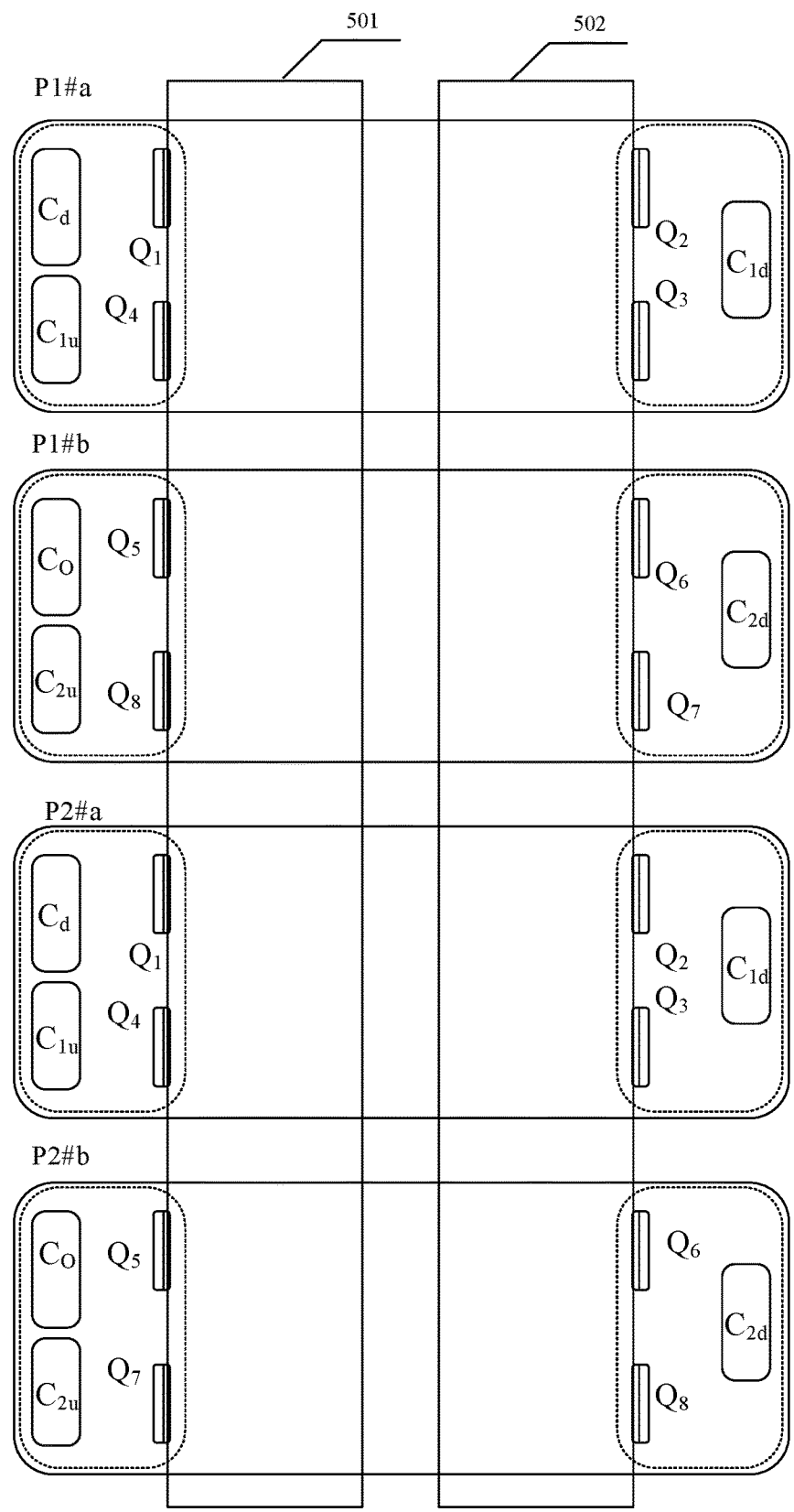
FIG. 6 is a schematic diagram of a switch layout of the flying capacitor three-level buck-boost converter shown in FIG. 5.

FIG. 6 is a schematic diagram of a switch layout of the flying capacitor three-level buck-boost converter shown in FIG. 5.

Referring to FIG. 5, the flying capacitor three-level buck-boost converter having two circuit units is taken as an example for description, while the present disclosure is not limited thereto.

In an embodiment of the present disclosure, the flying capacitor three-level buck-boost converter has two circuit units P1 # and P2 # connected in parallel, and each circuit unit may be a two-leg three-level buck-boost converter, where each circuit unit includes a first flying capacitor unit, a second flying capacitor unit, an input capacitor, a first bridge arm and a second bridge arm.

Bounding by the flying capacitor unit, each bridge arm is divided into two parts, which respectively form a first switching loop (or a third switching loop) and a second switching loop (or a fourth switching loop), where the first switching loop and the third switching loop may both be first compact connection loops, and the second switching loop and the fourth switching loop may both be second compact connection loops, where each compact connection loop includes two switches with complementary drive signals and one capacitor. First ends of the circuit units P1 # and P2 # are connected in parallel with first ends A+ and A− of the flying capacitor three-level buck-boost converter; and second ends of the circuit units P1 # and P2 # are connected in parallel with second ends B+ and B− of the flying capacitor three-level buck-boost converter.

In an exemplary embodiment, the flying capacitor three-level buck-boost converter may further include a first heat dissipation unit 501 and a second heat dissipation unit 502.

In an exemplary embodiment, the first heat dissipation unit and the second heat dissipation unit have a same or similar heat dissipation condition.

The first switches and the fourth switches in all the first switching loops (that is, the first switching loop in each circuit unit) are arranged on the first heat dissipation unit; the second switches and the third switches in all the second switching loops (that is, the second switching loop in each circuit unit) are arranged on the second heat dissipation unit; the fifth switches and the eighth switches in all the third switching loops (that is, the third switching loop in each circuit unit) are arranged on the first heat dissipation unit; and the sixth switch and the seventh switch in all the fourth switching loops (that is, the fourth switching loop in each circuit unit) are arranged on the second heat dissipation unit.

In the structural layout of the converter, all the switches of N first switching loops and N third switching loops in N circuit units may be arranged on a first radiator or in a first heat dissipation area, and all the switches of N second switching loops and N fourth switching loops in N circuit units may be arranged on a second radiator or in a second heat dissipation area.

The switches in the compact connection loops of a same level may be installed on a same radiator or in a same heat dissipation area, and the switches in the compact connection loops of different levels may be installed separately on two different radiators or in two different heat dissipation areas, so as to facilitate uniform distribution of heat load and maximize the utilization of heat dissipation resources, thereby reducing thermal stress and improving high temperature derating operation capacity and fault redundant operation load carrying capacity, which is beneficial to reduce costs and improve performance.

The devices and connection relationships of the circuit unit shown in FIG. 5 which are the same as those of the circuit unit shown in FIG. 4 may be referred to the description related to FIG. 5, which will not be elaborated here.

Referring to FIG. 6, in an exemplary embodiment, the input capacitor $C_d$ and the first capacitor $C_{1u}$ of the first switching loop in each circuit unit are located at a first side or a second side of the first heat dissipation unit 501. The second side is corresponding to the first side with respect to the first heat dissipation unit 501. The second capacitor $C_{1d}$ in the second switching loop is located at a first side or a second side of the second heat dissipation unit 502. The second side is corresponding to the first side with respect to the second heat dissipation unit 502. The output capacitor $C_O$ and the third capacitor $C_{2u}$ in the third switching loop are located at the first side or the second side of the first heat dissipation unit 501. And the fourth capacitor $C_{2d}$ in the fourth switching loop is located at the first side or the second side of the second heat dissipation unit 502.

In the embodiment, the input capacitor, the first capacitor, the output capacitor and the third capacitor of each circuit unit are located at a same side of the first heat dissipation unit, and the second capacitor and the fourth capacitor of each circuit unit are located at a same side of the second heat dissipation unit.

In an exemplary embodiment, the input capacitor $C_d$ and the first capacitor $C_{1u}$ of each circuit unit are arranged close to the corresponding first switch $Q_1$ and fourth switch $Q_4$; the second capacitor $C_{1d}$ is arranged close to the corresponding second switch $Q_2$ and third switch $Q_3$; the output capacitor $C_O$ and the third capacitor $C_{2u}$ are arranged close to the corresponding fifth switch $Q_5$ and eighth switch $Q_8$; and the fourth capacitor $C_{2d}$ is arranged close to the corresponding sixth switch $Q_6$ and seventh switch $Q_7$.

The input capacitor and the first capacitor of each circuit unit may be arranged on a side of the first heat dissipation unit that is close to the first switch and the fourth switch corresponding to the input capacitor and the first capacitor of each circuit unit; the output capacitor and the third capacitor of each circuit unit may be arranged on a side of the first heat dissipation unit that is close to the fifth switch and the eighth switch corresponding to the output capacitor and the third capacitor of each circuit unit; the second capacitor of each circuit unit may be arranged on a side of the second heat dissipation unit that is close to the second switch and the third switch corresponding to the second capacitor of each circuit unit; and the fourth capacitor of each circuit unit may be arranged on a side of the second heat dissipation unit that is close to the sixth switch and the seventh switch corresponding to the fourth capacitor of each circuit unit.

In an exemplary embodiment, a distance between the first capacitor and the second capacitor of each flying capacitor unit is a preset distance, and the preset distance may be selected according to actual needs.

In the flying capacitor three-level converter provided by the embodiments of the present disclosure, when different circuit units are in parallel operation, interleaved operation or complementary operation, the switches of the same level with complementary driving signals are mounted in a same heat dissipation area or on a same radiator, and thus uniform distribution of heat load is facilitated and the utilization of heat dissipation resources is maximized, therefore the available heat dissipation capacity of other operating circuit units can be increased when some circuit units do not work, thereby reducing thermal stress and improving high-temperature derating operation capacity and fault operation load carrying capacity, which is beneficial to reduce costs and improve performance.

Figure 7:
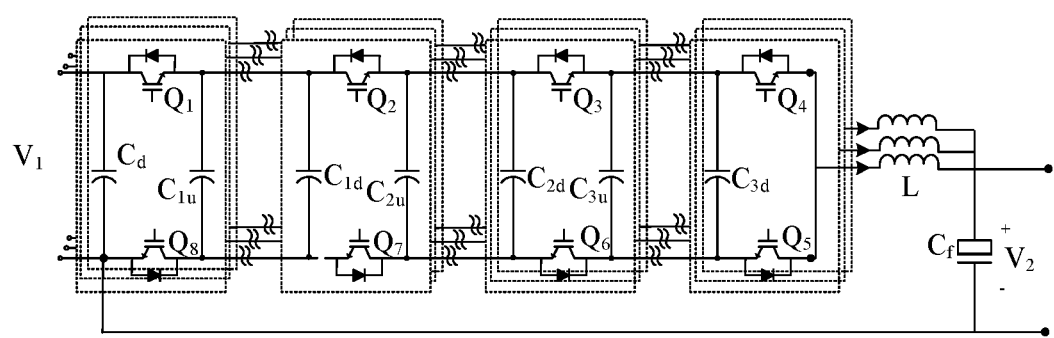
FIG. 7 is a schematic diagram illustrating a flying capacitor multilevel converter according to an exemplary embodiment.

FIG. 7 is a schematic diagram illustrating a flying capacitor multilevel converter according to an exemplary embodiment.

Figure 8:
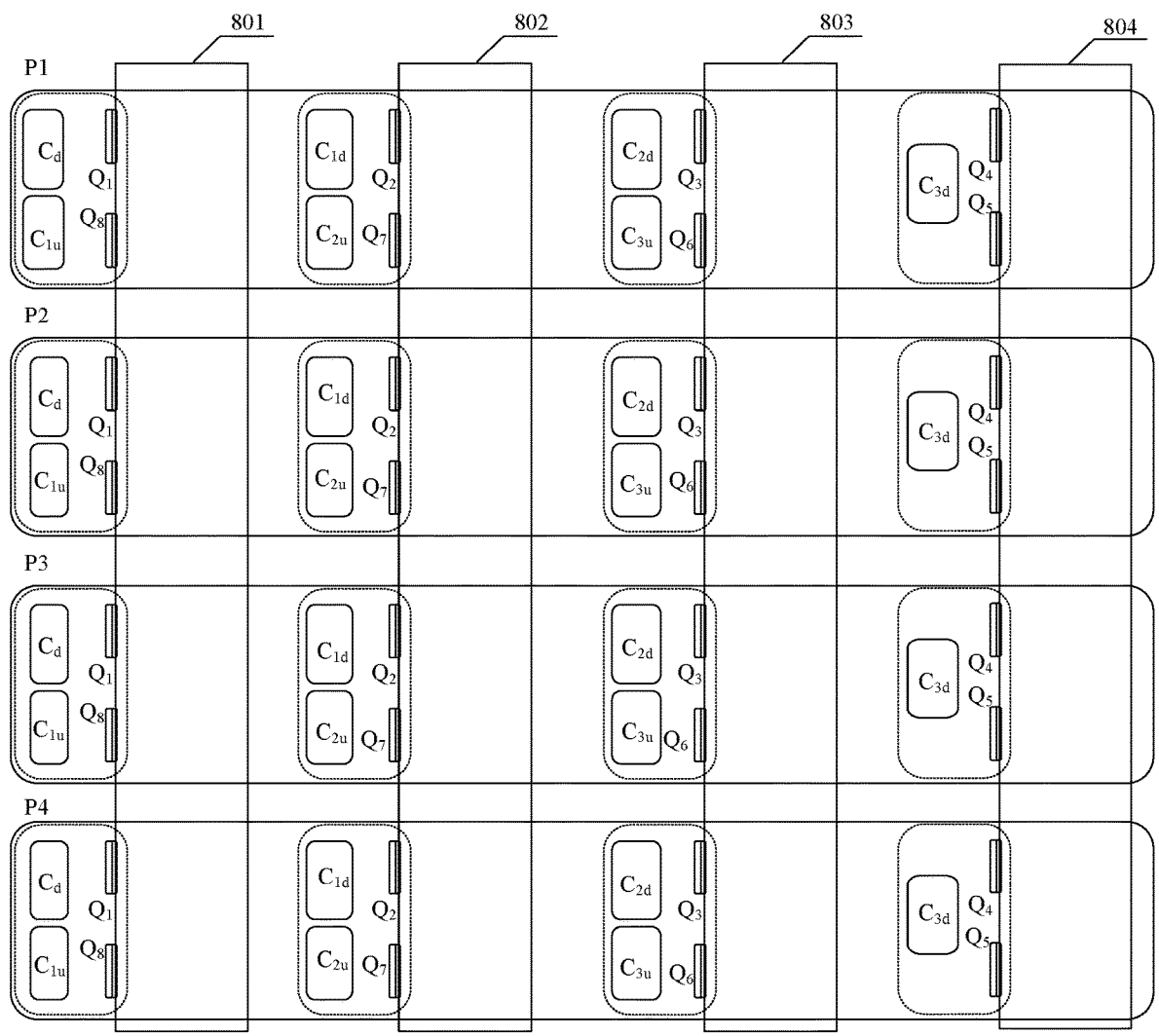
FIG. 8 is a schematic diagram of a switch layout of the flying capacitor multilevel converter shown in FIG. 7.

FIG. 8 is a schematic diagram of a switch layout of the flying capacitor multilevel converter shown in FIG. 7.

In an embodiment of the present disclosure, a flying capacitor multilevel converter may include N circuit units, where N is a positive integer greater than 1. Each circuit unit may include m flying capacitor units, an input capacitor, and a bridge arm, where m is a positive integer greater than or equal to 1, each bridge arm includes 2×(m+1) switches, and the 2×(m+1) switches are sequentially connected in series. Each flying capacitor unit includes a first capacitor and a second capacitor, where the first capacitor is connected in parallel with the second capacitor; a first flying capacitor unit is connected in parallel at both ends of a series branch which includes switches from a second switch to the (2m+1)th switch, where the input capacitor, a first switch, the first capacitor in the first flying capacitor unit and the (2×(m+1))th switch form a first switching loop; the second capacitor in the first flying capacitor unit, the first capacitor in a second flying capacitor unit, the second switch, and the (2m+1)th switch form a second switching loop; a $k^{th}$ flying capacitor unit is connected in parallel at both ends of a series branch which includes switches from a (k+1)th switch to the (2m+2-k)th switch, where k is a natural number from 2 to m; the second capacitor in the (k−1)th flying capacitor unit, a $k^{th}$ switch, the first capacitor in the $k^{th}$ flying capacitor unit, and the (2m+3-k)th switch form a $k^{th}$ switching loop; and the second capacitor in the $m^{th}$ flying capacitor unit, the (m+1)th switch, and the (m+2)th switch form the (m+1)th switching loop.

Referring to FIG. 7, each circuit unit including 3 (that is, m=3) flying capacitor units is taken as an example for description, while the present disclosure is not limited to this.

For example, each circuit unit may include 3 flying capacitor units, an input capacitor, and a bridge arm, where each bridge arm includes 8 switches ($Q_1$ to $Q_8$), which are sequentially connected in series. Each flying capacitor unit includes a first capacitor and a second capacitor, and the first capacitor is connected in parallel with the second capacitor.

A first flying capacitor unit is connected in parallel at both ends of a series branch which includes switches from a second switch $Q_2$ to a seventh switch $Q_7$, where the input capacitor $C_d$, a first switch $Q_1$, the first capacitor $C_{1u}$ in the first flying capacitor unit and an eighth switch $Q_8$ form a first switching loop; a second flying capacitor unit is connected in parallel at both ends of a series branch which includes switches from a third switch $Q_3$ to a sixth switch $Q_6$, where a second capacitor $C_{2d}$ in the first flying capacitor unit, a second switch $Q_2$, a first capacitor $C_{2u}$ in the second flying capacitor unit and an seventh switch $Q_7$ form a second switching loop; a third flying capacitor unit is connected in parallel at both ends of a series branch which includes switches from a fourth switch $Q_4$ to a fifth switch $Q_5$, where a second capacitor $C_{2d}$ in the second flying capacitor unit, a third switch $Q_3$, a first capacitor $C_{3u}$ in the third flying capacitor unit and a sixth switch $Q_6$ form a third switching loop; and a second capacitor $C_{ad}$ in the third flying capacitor unit, the fourth switch $Q_4$, and the fifth switch $Q_5$ form a fourth switching loop.

In an exemplary embodiment, the flying capacitor multilevel converter may further include m+1 heat dissipation units; where the first switches and the (2×(m+1))th switches in the first switching loops are arranged on the first heat dissipation unit; the second switches and the (2m+1)th switches in the second switching loops are arranged on the second heat dissipation unit; the $k^{th}$ switches and the (2m+3−k)th switches in the $k^{th}$ switching loops are arranged on the $k^{th}$ heat dissipation unit; and the (m+1)th switches and the (m+2)th switches in the (m+1)th switching loops are arranged on the (m+1)th heat dissipation unit.

Each circuit unit including 3 (that is, m=3) flying capacitor units is still taken as an example for description.

Referring to FIG. 8, for example, the flying capacitor multilevel converter further includes four heat dissipation units (801 to 804); where the first switch $Q_1$ and the eighth switch $Q_8$ in the first switching loop are arranged on a first heat dissipation unit 801; the second switch $Q_2$ and the seventh switch $Q_7$ in the second switching loop are arranged on a second heat dissipation unit 802; the third switch $Q_3$ and the sixth switch $Q_6$ in the third switching loop are arranged on a third heat dissipation unit 803; and the fourth switch $Q_4$ and the fifth switch $Q_5$ in the fourth switching loop are arranged on a fourth heat dissipation unit 804.

In an exemplary embodiment, all the heat dissipation units above-mentioned may have a same or similar heat dissipation condition.

In the structural layout of the converter, all the switches of N first switching loops in N circuit units may be arranged on a first radiator or in a first heat dissipation area, all the switches of N second switching loops in N circuit units may be arranged on a second radiator or in a second heat dissipation area, and all the switches of N (m+1)th switching loops in N circuit units may be arranged on the (m+1)th radiator or in the (m+1)th heat dissipation area.

The switches in the compact connection loops of a same level may be arranged on a same radiator or in a same heat dissipation area, and the switches in the compact connection loops of different levels may be arranged separately on two different radiators or in two different heat dissipation areas.

In an exemplary embodiment, the input capacitor and the first capacitor of the first flying capacitor unit in the first switching loop are located at a first side or a second side of the first heat dissipation unit, and the second side is opposite to the first side with respect to the first heat dissipation unit; the second capacitor of the first flying capacitor unit and the first capacitor of the second flying capacitor unit in the second switching loop are located at a first side or a second side of the second heat dissipation unit, and the second side is opposite to the first side with respect to the second heat dissipation; the second capacitor of the $(k-1)^{th}$ flying capacitor unit and the first capacitor of the $k^{th}$ flying capacitor unit in the $k^{th}$ switching loop are located at a first side or a second side of the $k^{th}$ heat dissipation unit, and the second side is opposite to the first side with respect to the $k^{th}$ heat dissipation unit; and the second capacitor of the $m^{th}$ flying capacitor unit in the $(m+1)^{th}$ switching loop is located at a first side or a second side of the $(m+1)^{th}$ heat dissipation unit, and the second side is opposite to the first side with respect to the $(m+1)^{th}$ heat dissipation unit.

The input capacitor and the first capacitor of the first flying capacitor unit in each circuit unit are located at a same side of the first heat dissipation unit, the second capacitor of the first flying capacitor unit and the first capacitor of the second flying capacitor unit in each circuit unit are located at a same side of the second heat dissipation unit, the second capacitor of the $(m-1)^{th}$ flying capacitor unit and the first capacitor of the $m^{th}$ flying capacitor unit in each circuit unit are located at a same side of the $m^{th}$ heat dissipation unit, and the second capacitor of the $m^{th}$ flying capacitor unit in each circuit unit is located at a same side of the $(m+1)^{th}$ heat dissipation unit.

In an exemplary embodiment, the input capacitor and the first capacitor of the first flying capacitor unit are arranged close to the corresponding first switch and (2×(m+1))th switch; the second capacitor of the first flying capacitor unit and the first capacitor of the second flying capacitor unit are arranged close to the corresponding second switch and (2m+1)th switch; the second capacitor of the (k−1)th flying capacitor unit and the first capacitor of the $k^{th}$ flying capacitor unit are arranged close to the corresponding $k^{th}$ switch and (2m+3−k)th switch; and the second capacitor of the $m^{th}$ flying capacitor unit is arranged close to the corresponding (m+1)th switch and the (m+2)th switch.

The input capacitor and the first capacitor of the first flying capacitor unit in each circuit unit may be arranged on a side of the first heat dissipation unit that is close to the corresponding switch, the second capacitor of the first flying capacitor unit and the first capacitor of the second flying capacitor unit in each circuit unit may be arranged on a side of the second heat dissipation unit that is close to the corresponding switch, the second capacitor of the (m−1)th flying capacitor unit and the first capacitor of the $m^{th}$ flying capacitor unit in each circuit unit may be arranged on a side of the $m^{th}$ heat dissipation unit that is close to the corresponding switch, and the second capacitor of the $m^{th}$ flying capacitor unit in each circuit unit may be arranged on a side of the (m+1)th heat dissipation unit that is close to the corresponding switch.

Referring to FIG. 8, for example, the input capacitor $C_d$ and the first capacitor $Q_{1u}$ of the first flying capacitor unit in each circuit unit are arranged on a side of the heat dissipation unit 801 that is close to the first switch $Q_1$ and the eighth switch $Q_8$; the second capacitor $Q_{1d}$ of the first flying capacitor unit and the first capacitor $Q_{2u}$ of the second flying capacitor unit in each circuit unit are arranged on a side of the heat dissipation unit 802 that is close to the second switch $Q_2$ and the seventh switch $Q_7$; the second capacitor $Q_{2d}$ of the second flying capacitor unit and the first capacitor $Q_{3u}$ of the third flying capacitor unit in each circuit unit are arranged on a side of the heat dissipation unit 803 that is close to the third switch $Q_3$ and the sixth switch $Q_6$; and the second capacitor $Q_{3d}$ of the third flying capacitor unit in each circuit unit is arranged on a side of the heat dissipation unit 804 that is close to the fourth switch $Q_4$ and the fifth switch $Q_5$.

In the embodiments of the present disclosure, a capacitance value of the first capacitor and a capacitance value of the second capacitor in the flying capacitor unit above-mentioned may be equal or not.

In an exemplary embodiment, the capacitance value of the first capacitor and the capacitance value of the second capacitor in each flying capacitor unit are different.

In an exemplary embodiment, a distance between the first capacitor and the second capacitor in each flying capacitor unit is a preset distance, and the preset distance may be selected according to actual needs.

In an exemplary embodiment, all the bridge arms are connected in parallel, that is, the first ends of all the circuit units are connected in parallel and the second ends of all the circuit units are connected in parallel.

In the flying capacitor three-level converter provided by the embodiments of the present disclosure, each flying capacitor includes two capacitors connected in parallel, and the two capacitors respectively form a switching loop with two pairs of switches with complementary driving signals and connected to the flying capacitor unit, so as to facilitate the absorption of switching voltage spikes; each pair of the switches with complementary driving signals is protected by a switching loop (including a capacitor), so that the voltage stress thereof is smaller than that of all switches in a same bridge arm being arranged together, and the operation of the switches is safer and more reliable; and each pair of the switches with complementary driving signals has an exclusive compact switching loop, allowing the internal circuit layout of the product to be simple and convenient, and being beneficial to electrical design and structural design. In addition, the switches with complementary driving signals of a same level are arranged in a same heat dissipation area or on a same radiator, so as to facilitate uniform distribution of heat load and maximize the utilization of heat dissipation resources, so that the available heat dissipation capacity of other operating circuit units will be increased when some circuit units do not work, thereby reducing thermal stress and improving high-temperature derating operation capacity and fault operation load carrying capacity, which is beneficial to reduce costs and improve performance.

The exemplary embodiments of the present disclosure have been specifically shown and described above. It should be understood that the present disclosure is not limited to the detailed structures, arrangement modes or implementation methods described herein; rather, the present disclosure is intended to cover various modifications and equivalent settings contained within the spirit and scope of the appended claims.

What is claimed is:

1. A flying capacitor three-level converter, comprising:
a plurality of circuit units, wherein each of the plurality of circuit units comprises:
an input capacitor;
a bridge arm, electrically connected with the input capacitor in parallel, wherein the bridge arm comprises a first switch, a second switch, a third switch and a fourth switch electrically and sequentially connected in series; and
a flying capacitor unit, wherein the flying capacitor unit comprises a first capacitor and a second capacitor, and the first capacitor and the second capacitor are electrically connected in parallel and electrically connected with a series branch in parallel, and the series branch comprises the second switch and the third switch;
wherein the input capacitor, the first switch, the first capacitor and the fourth switch form a first switching loop, and the second capacitor, the second switch and the third switch form a second switching loop;
wherein the converter further comprises a first heat dissipation unit and a second heat dissipation unit;
wherein the first switches and the fourth switches in all the first switching loops are arranged on the first heat dissipation unit;
wherein the second switches and the third switches in all the second switching loops are arranged on the second heat dissipation unit.

2. The converter according to claim 1, wherein the first heat dissipation unit and the second heat dissipation unit have a same or similar heat dissipation condition.

3. The converter according to claim 1, wherein the input capacitor and the first capacitor are located at a first side or a second side of the first heat dissipation unit, and the second side is corresponding to the first side with respect to the first heat dissipation unit; and
the second capacitor is located at a first side or a second side of the second heat dissipation unit, and the second side is corresponding to the first side with respect to the second heat dissipation unit.

4. The converter according to claim 1, wherein the input capacitor and the first capacitor are arranged closer to the corresponding first switch and fourth switch than other power components; and
the second capacitor is arranged closer to the corresponding second switch and third switch than other power components.

5. The converter according to claim 1, wherein a capacitance value of the first capacitor is different from a capacitance value of the second capacitor.

6. The converter according to claim 1, wherein a distance between the first capacitor and the second capacitor is a preset distance.

7. The converter according to claim 1, wherein all the bridge arms are electrically connected in parallel.

8. A flying capacitor three-level buck-boost converter, comprising one or more circuit units, wherein each circuit unit of the one or more circuit units comprises a first flying capacitor unit, a second flying capacitor unit, an input capacitor, an output capacitor, an inductor, a first bridge arm and a second bridge arm;

the input capacitor is electrically connected in parallel with the first bridge arm, and the output capacitor is electrically connected in parallel with the second bridge arm;
the first bridge arm comprises a first switch, a second switch, a third switch, and a fourth switch, wherein the first switch, the second switch, the third switch and the fourth switch are sequentially connected in series;
the second bridge arm comprises a fifth switch, a sixth switch, a seventh switch, and an eighth switch, wherein the fifth switch, the sixth switch, the seventh switch and the eighth switch are sequentially connected in series;
the first flying capacitor unit comprises a first capacitor and a second capacitor, wherein the first capacitor and the second capacitor are electrically connected in parallel and are electrically connected in parallel with a first series branch, and the first series branch comprises the second switch and the third switch in the first bridge arm;
the input capacitor, the first switch, the first capacitor and the fourth switch form a first switching loop;
the second switch, the third switch and the second capacitor form a second switching loop;
the second flying capacitor unit comprises a third capacitor and a fourth capacitor, wherein the third capacitor and the fourth capacitor are electrically connected in parallel and are electrically connected in parallel with a second series branch, and the second series branch comprises the sixth switch and the seventh switch in the second bridge arm;
the output capacitor, the fifth switch, the third capacitor and the eighth switch form a third switching loop;
the sixth switch, the seventh switch and the fourth capacitor form a fourth switching loop; and
the inductor is coupled between a junction node of the second switch and the third switch in the first bridge arm and a junction node of the sixth switch and the seventh switch in the second bridge arm;
wherein the converter further comprises a first heat dissipation unit and a second heat dissipation unit;
wherein the first switches and the fourth switches in all the first switching loops are arranged on the first heat dissipation unit;
wherein the second switches and the third switches in all the second switching loops are arranged on the second heat dissipation unit;
wherein the fifth switches and the eighth switches in all the third switching loops are arranged on the first heat dissipation unit; and
wherein the sixth switches and the seventh switches in all the fourth switching loops are arranged on the second heat dissipation unit.

9. The converter according to claim 8, wherein the first heat dissipation unit and the second heat dissipation unit have a same or similar heat dissipation condition.

10. The converter according to claim 8, wherein
the input capacitor and the first capacitor in the first switching loop are located at a first side or a second side of the first heat dissipation unit, and the second side is corresponding to the first side with respect to the first heat dissipation unit;
the second capacitor in the second switching loop is located at a first side or a second side of the second heat dissipation unit, and the second side is corresponding to the first side with respect to the second heat dissipation unit;

the output capacitor and the third capacitor in the third switching loop are located at the first side or the second side of the first heat dissipation unit; and the fourth capacitor in the fourth switch loop is located at the first side or the second side of the second heat dissipation unit.

11. The converter according to claim 8, wherein the input capacitor and the first capacitor are arranged closer to the corresponding first switch and fourth switch than other power components;

the second capacitor is arranged closer to the corresponding second switch and third switch than other power components;

the output capacitor and the third capacitor are arranged closer to the corresponding fifth switch and eighth switch than other power components; and the fourth capacitor is arranged closer to the corresponding sixth switch and seventh switch than other power components.

12. The converter according to claim 8, wherein the converter comprises at least two circuit units, and all the first bridge arms of the at least two circuit units are electrically connected in parallel, and all the second bridge arms of the at least two circuit units are electrically connected in parallel.

13. A flying capacitor multilevel converter, comprising:

N circuit units, wherein each circuit unit of the N circuit units comprises m flying capacitor units, an input capacitor and a bridge arm, wherein N is a positive integer greater than 1, and m is a positive integer greater than or equal to 2;

wherein the bridge arm comprises 2×(m+1) switches, and the 2×(m+1) switches are sequentially connected in series;

wherein each of the m flying capacitor units comprises a first capacitor and a second capacitor, and the first capacitor is electrically connected in parallel with the second capacitor;

wherein a first flying capacitor unit of the m flying capacitor units is electrically connected in parallel at both ends of a series branch which is defined by a second switch to the (2m+1)th switch, and the input capacitor, a first switch, the first capacitor of the first flying capacitor unit and the 2×(m+1)th switch form a first switching loop;

wherein the second capacitor of the first flying capacitor unit, the second switch, the first capacitor of a second flying capacitor unit of the m flying capacitor units and the (2m+1)th switch form a second switching loop;

wherein a $k^{th}$ flying capacitor unit of the m flying capacitor units is electrically connected in parallel at both ends of a series branch which is defined by the (k+1)th switch to the (2m+2−k)th switch, wherein k is a natural number from 2 to m;

wherein the second capacitor of the (k−1)th flying capacitor unit of the m flying capacitor units, a $k^{th}$ switch, the first capacitor of the $k^{th}$ flying capacitor unit and the (2m+3−k)th switch form a $k^{th}$ switching loop;

wherein the second capacitor of a $m^{th}$ flying capacitor unit of the m flying capacitor units, a (m+1)th switch and a (m+2)th switch form a (m+1)th switching loop;

wherein the converter further comprises (m+1) heat dissipation units;

wherein the first switches and the (2×(m+1))th switches in all the first switching loops are arranged on the first heat dissipation unit;

wherein the second switches and the (2m+1)th switches in all the second switching loops are arranged on the second heat dissipation unit;

wherein the $k^{th}$ switches and the (2m+3−k)th switches in all the kth switching loops are arranged on the $k^{th}$ heat dissipation unit;

wherein the (m+1)th switches and the (m+2)th switches in all the (m+1)th switching loops are arranged on the (m+1)th heat dissipation unit.

14. The converter according to claim 13, wherein the (m+1) heat dissipation units have a same or similar heat dissipation condition.

15. The converter according to claim 13, wherein the input capacitor and the first capacitor of the first flying capacitor unit in the first switching loop are located at a first side or a second side of the first heat dissipation unit, and the second side is opposite to the first side with respect to the first heat dissipation unit;

wherein the second capacitor of the first flying capacitor unit and the first capacitor of the second flying capacitor unit in the second switching loop are located at a first side or a second side of the second heat dissipation unit, and the second side is opposite to the first side with respect to the second heat dissipation unit;

wherein the second capacitor of the (k−1)th flying capacitor unit and the first capacitor of the $k^{th}$ flying capacitor unit in the $k^{th}$ switching loop are located at a first side or a second side of the $k^{th}$ heat dissipation unit, and the second side is opposite to the first side with respect to the $k^{th}$ heat dissipation unit;

wherein the second capacitor of the $m^{th}$ flying capacitor unit in the (m+1)th switching loop is located at a first side or a second side of the (m+1)th heat dissipation unit, and the second side is opposite to the first side with respect to the (m+1)th heat dissipation unit.

16. The converter according to claim 13, wherein the input capacitor and the first capacitor of the first flying capacitor unit are arranged closer to the corresponding first switch and (2×(m+1))th switch than other power components;

wherein the second capacitor of the first flying capacitor unit and the first capacitor of the second flying capacitor unit are arranged closer to the corresponding second switch and (2m+1)th switch than other power components;

wherein the second capacitor of the (k−1)th flying capacitor unit and the first capacitor of the $k^{th}$ flying capacitor unit are arranged closer to the corresponding $k^{th}$ switch and (2m+3−k)th switch than other power components;

wherein the second capacitor of the $m^{th}$ flying capacitor unit is arranged closer to the corresponding (m+1)th switch and (m+2)th switch than other power components.

17. The converter according to claim 13, wherein a capacitance value of the first capacitor is different from a capacitance value of the second capacitor with respect to each of the m flying capacitor units.

18. The converter according to claim 13, wherein all the bridge arms are electrically connected in parallel.

* * * * *